(12) United States Patent
Smith

(10) Patent No.: US 8,546,844 B2
(45) Date of Patent: Oct. 1, 2013

(54) PROCESS FOR FORMING AN ORGANIC LIGHT-EMITTING DIODE LUMINAIRES HAVING A SINGLE LIGHT-EMITTING LAYER WITH AT LEAST TWO LIGHT-EMITTING DOPANTS

(75) Inventor: Eric Maurice Smith, Hockessin, DE (US)

(73) Assignee: E I du Pont de Nemours and Company, Wilmington, DE (US)

(*) Notice: Subject to any disclaimer, the term of this patent is extended or adjusted under 35 U.S.C. 154(b) by 121 days.

(21) Appl. No.: 12/993,259

(22) PCT Filed: Jun. 26, 2009

(86) PCT No.: PCT/US2009/048746
§ 371 (c)(1),
(2), (4) Date: Nov. 18, 2010

(87) PCT Pub. No.: WO2009/158555
PCT Pub. Date: Dec. 30, 2009

(65) Prior Publication Data
US 2011/0073853 A1    Mar. 31, 2011

Related U.S. Application Data

(60) Provisional application No. 61/075,967, filed on Jun. 26, 2008.

(51) Int. Cl.
*H01L 33/00* (2010.01)
(52) U.S. Cl.
USPC .............................. 257/102; 257/89
(58) Field of Classification Search
USPC ................................ 257/89, 102
See application file for complete search history.

(56) References Cited

U.S. PATENT DOCUMENTS

| | | | |
|---|---|---|---|
| 5,683,823 A | 11/1997 | Shi et al. | |
| 6,303,238 B1 | 10/2001 | Thompson et al. | |
| 6,600,175 B1 | 7/2003 | Baretz et al. | |
| 6,627,333 B2 | 9/2003 | Hatwar | |
| 6,629,772 B2 | 10/2003 | Brunfeld | |
| 6,670,645 B2 | 12/2003 | Grushin et al. | |
| 6,875,524 B2 | 4/2005 | Hatwar et al. | |
| 6,885,026 B1 | 4/2005 | Helber et al. | |
| 6,921,589 B2 | 7/2005 | Kohama et al. | |
| 6,992,437 B2 | 1/2006 | Lee et al. | |
| 7,250,512 B2 | 7/2007 | Lecloux et al. | |
| 7,362,796 B2 | 4/2008 | Shigeno | |
| 7,425,653 B2 | 9/2008 | Funahashi | |
| 7,466,073 B2 | 12/2008 | Kishino et al. | |
| 7,663,140 B2 | 2/2010 | Yamazaki et al. | |
| 7,794,858 B2 | 9/2010 | Park et al. | |
| 7,803,469 B2 | 9/2010 | Lee et al. | |
| 7,816,859 B2 | 10/2010 | Spindler et al. | |
| 7,825,582 B2 | 11/2010 | Furukawa et al. | |
| 7,834,214 B2 | 11/2010 | Funahashi | |
| 8,080,277 B2 | 12/2011 | Takashima et al. | |
| 8,136,911 B2 | 3/2012 | Takashima et al. | |
| 2001/0019782 A1 | 9/2001 | Igarashi et al. | |
| 2001/0053462 A1 | 12/2001 | Mishima | |
| 2002/0024293 A1 | 2/2002 | Igarashi et al. | |
| 2003/0072964 A1 | 4/2003 | Kwong et al. | |
| 2003/0081431 A1 | 5/2003 | Brunfeld | |
| 2003/0124381 A1 | 7/2003 | Thompson et al. | |
| 2003/0175553 A1 | 9/2003 | Thompson et al. | |
| 2004/0033388 A1 | 2/2004 | Kim et al. | |
| 2004/0102577 A1 | 5/2004 | Hsu et al. | |
| 2004/0127637 A1 | 7/2004 | Hsu et al. | |
| 2004/0201064 A1* | 10/2004 | Hirai et al. | 257/347 |
| 2004/0209118 A1 | 10/2004 | Seo et al. | |
| 2004/0262576 A1 | 12/2004 | Thompson et al. | |
| 2005/0064233 A1 | 3/2005 | Matsuura et al. | |
| 2005/0095452 A1 | 5/2005 | Begley et al. | |
| 2005/0100760 A1* | 5/2005 | Yokoyama | 428/690 |
| 2005/0158577 A1 | 7/2005 | Ishibashi et al. | |
| 2005/0184287 A1 | 8/2005 | Herron et al. | |
| 2005/0205860 A1 | 9/2005 | Hsu et al. | |
| 2005/0233167 A1 | 10/2005 | Che et al. | |
| 2005/0244670 A1 | 11/2005 | Saitoh et al. | |
| 2006/0008673 A1 | 1/2006 | Kwong et al. | |
| 2006/0033421 A1* | 2/2006 | Matsuura et al. | 313/499 |
| 2006/0066225 A1 | 3/2006 | Kishino et al. | |
| 2006/0105198 A1 | 5/2006 | Spindler et al. | |
| 2006/0134460 A1 | 6/2006 | Kondakova et al. | |

(Continued)

FOREIGN PATENT DOCUMENTS

| EP | 1 061 112 A1 | 12/2000 |
|---|---|---|
| EP | 786925 A2 | 6/2002 |

(Continued)

OTHER PUBLICATIONS

Endo et al., "Measurement of photoluminescence efficiency of Ir(III) phenylpyridine derivatives in solution and solid-state films", Chemical Physics Letters 460 (2008) 155-157.*

(Continued)

*Primary Examiner* — Fernando L Toledo
*Assistant Examiner* — Peter Bradford

(57) ABSTRACT

There is provided n organic light-emitting diode luminaire. The luminaire includes a first electrode, a second electrode, and a light-emitting layer therebetween. The light-emitting layer includes a small molecule host material having dispersed therein a first dopant having a first emitted color and a second dopant having a second emitted color. The overall emission color is white.

9 Claims, 1 Drawing Sheet

(56) References Cited

U.S. PATENT DOCUMENTS

| | | | |
|---|---|---|---|
| 2006/0152146 A1 | 7/2006 | Funahashi | |
| 2006/0210830 A1 | 9/2006 | Funahashi et al. | |
| 2006/0220011 A1 | 10/2006 | Kitamura et al. | |
| 2006/0267001 A1* | 11/2006 | Hung | 257/40 |
| 2006/0283546 A1 | 12/2006 | Tremel et al. | |
| 2007/0015006 A1 | 1/2007 | Lee et al. | |
| 2007/0029906 A1 | 2/2007 | Hack et al. | |
| 2007/0063638 A1 | 3/2007 | Tokairin et al. | |
| 2007/0126012 A1 | 6/2007 | Omura et al. | |
| 2007/0126347 A1* | 6/2007 | Jarikov et al. | 313/506 |
| 2007/0145886 A1* | 6/2007 | Aziz et al. | 313/504 |
| 2007/0212568 A1* | 9/2007 | Wang | 428/690 |
| 2007/0292713 A9 | 12/2007 | Dobbs et al. | |
| 2007/0292718 A1 | 12/2007 | Lecloux et al. | |
| 2008/0004445 A1 | 1/2008 | Hosokawa et al. | |
| 2008/0049413 A1* | 2/2008 | Jinde et al. | 362/84 |
| 2008/0067473 A1 | 3/2008 | Walker et al. | |
| 2008/0093989 A1 | 4/2008 | Spindler et al. | |
| 2008/0116790 A1 | 5/2008 | Kho et al. | |
| 2008/0122348 A1 | 5/2008 | Jeong et al. | |
| 2008/0160347 A1 | 7/2008 | Wang et al. | |
| 2008/0268283 A1 | 10/2008 | Funahashi | |
| 2008/0284319 A1 | 11/2008 | Lee et al. | |
| 2008/0286605 A1 | 11/2008 | Takeda | |
| 2009/0039776 A1 | 2/2009 | Yamada et al. | |
| 2009/0045736 A1 | 2/2009 | Kho et al. | |
| 2009/0053488 A1 | 2/2009 | Jinde et al. | |
| 2009/0085468 A1 | 4/2009 | Funahashi et al. | |
| 2009/0174308 A1 | 7/2009 | Yamazaki et al. | |
| 2009/0189509 A1 | 7/2009 | Qiu et al. | |
| 2010/0295032 A1 | 11/2010 | Kwong et al. | |
| 2010/0314636 A1* | 12/2010 | Matsunami et al. | 257/88 |
| 2011/0248249 A1 | 10/2011 | Forrest et al. | |
| 2013/0084548 A1 | 4/2013 | Caverly | |

FOREIGN PATENT DOCUMENTS

| | | |
|---|---|---|
| EP | 1 561 794 A1 | 10/2005 |
| EP | 1905809 A2 | 4/2008 |
| JP | 10161567 A | 6/1998 |
| JP | 2003092002 A | 3/2003 |
| JP | 2006019022 A | 1/2006 |
| JP | 2006040856 A | 2/2006 |
| JP | 2006063233 A | 3/2006 |
| JP | 2006269253 A | 10/2006 |
| JP | 2007011063 A | 1/2007 |
| JP | 2007027679 A | 2/2007 |
| JP | 2007141789 A | 6/2007 |
| JP | 2008078014 A | 4/2008 |
| JP | 2008085363 A | 4/2008 |
| JP | 2009048829 A | 3/2009 |
| KR | 100796615 B1 | 1/2008 |
| KR | 100882911 B1 | 2/2009 |
| KR | 1020090083275 A | 8/2009 |
| KR | 100920533 B1 | 10/2009 |
| WO | 0070655 A2 | 11/2000 |
| WO | 0141512 A1 | 6/2001 |
| WO | WO03/008424 A1 | 1/2003 |
| WO | WO03/040257 A1 | 5/2003 |
| WO | WO03/063555 A1 | 7/2003 |
| WO | WO03/091688 A2 | 11/2003 |
| WO | WO2004/016710 A1 | 2/2004 |
| WO | WO2005/052027 A1 | 6/2005 |
| WO | 2005081587 A1 | 9/2005 |
| WO | 2006025512 A1 | 3/2006 |
| WO | 2009018009 A1 | 2/2009 |

OTHER PUBLICATIONS

Kirk-Othmer Encyclopedia of Chemical Technology, Fourth Edition, vol. 18, pp. 837-860, 1996 Y. Wang.

"Flexible light-emitting diodes made from soluble conducting polymer" Nature, vol. 357, pp. 477 479 (Jun. 11, 1992).

International Search Report, Korean Intellectual Property Office, Daejeon, Republic of Korea, in PCT/US2009/048746, PCT Counterpart to the present U.S. Appl. No. 12/993,259, Ju Seung Kim, Authorized Officer, Jun. 14, 2010.

"Bright white small molecular organic light emitting devices based on a red emiting guest-host layer and blue emitting 4,4—bis(2,2-diphenylviny)-1, 1-biphenyl,1", APL, vol. 81, No. 9, pp. 1738-1740 (K. O. Cheon and J. Shinar) Aug. 26, 2002.

"Efficient organic electrophosphorescent white light emitting device with a triple doped emissive layer", Adv. Mate., vol. 16, No. 7, pp. 624-628 (Brian W. D'Andrade et al) Apr. 5, 2004.

Ma et al., "Platinum Binuclear Complexes as Phosphorescent Dopants for Monochromatic and White Organic Light-Emitting Diodes," Advanced Functional Materials, 2006, vol. 16, No. 18, pp. 2438-2446.

Chu et al., "Comparitive Study of Single and Multiemissive Layers in Inverted White Organic Light-Emitting Devices," Applied Physics Letters, 2006, vol. 89, No. 11, p. 113502.

Ge et al., "Solution Processible Bipolar Triphenylamine Benzimidazole Derivatives for Highly Efficient Single Layer Organic Light Emitting Diodes," Chemistry of Materials, 2008, vol. 20, pp. 2532-2537.

Kawamura et al., "Energy Transfer in Polymer Electrophosphorescent Light Emitting Devices with Single and Multiple Doped Luminescent Layers," Journal of Applied Physics, 2002, vol. 92, No. 1, pp. 87-93.

Shih et al., "Novel Carbazole/Fluorene Hybrids: Host Materials for Blue Phosphorescent OLEDs," Organic Letters, 2006, vol. 8, pp. 2799-2802.

Zhang et al., "Blue and White Organic Electroluminescent Devices Based on 9,10-bis(2'-naphthyl)anthracene," Chemical Physical Letters, 2003, vol. 369, No. 3-4, pp. 478-482.

Extended European Search Report for Application No. 09771086.7, counterpart to U.S. Appl. No. 12/993,259; Jul. 10, 2012.

International Search Report for Application No. PCT/US2010/054394; Ju Seung Kim, Authorized Officer; Korean Intellectual Property Office; Jun. 20, 2011.

International Search Report for Application No. PCT/US2010/054404; Kim, Ju Seung, Authorized Officer; KIPO; May 31, 2011.

International Search Report for Application No. PCT/US2010/054613; KIPO; May 31, 2011.

International Search Report for Application No. PCT/US2010/054683; KIPO; Jun. 20, 2011.

International Search Report for Application No. PCT/US2010/054713; KIPO; Jun. 20, 2011.

International Search Report for Application No. PCT/US2010/054724; Ju Seung Kim, Authorizer Officer; Korean Intellectual Property Office; Jun. 20, 2011.

International Search Report for Application No. PCT/US2010/059726; Kim, Ju Seung, Authorizer Officer; KIPO; May 27, 2011.

International Search Report for Application No. PCT/US2010/059787; Ju Seung, Authorized Officer; KIPO; May 31, 2011.

International Search Report for Application No. PCT/US2010/059789; Kim, Je Seung, Authorized Officer; KIPO; May 31, 2011.

International Search Report for Application No. PCT/US2010/059825; Kim, Ju Seung, Authorizer Officer; KIPO; Jun. 21, 2011.

* cited by examiner

PROCESS FOR FORMING AN ORGANIC LIGHT-EMITTING DIODE LUMINAIRES HAVING A SINGLE LIGHT-EMITTING LAYER WITH AT LEAST TWO LIGHT-EMITTING DOPANTS

RELATED APPLICATION DATA

This application claims priority under 35 U.S.C. §119(e) from U.S. Provisional Application 61/075,967 filed Jun. 26, 2008 which is incorporated by reference in its entirety.

BACKGROUND INFORMATION

1. Field of the Disclosure

This disclosure relates in general to organic light-emitting diode ("OLED") luminaires. It also relates to a process for making such devices.

2. Description of the Related Art

Organic electronic devices that emit light are present in many different kinds of electronic equipment. In all such devices, an organic active layer is sandwiched between two electrodes. At least one of the electrodes is light-transmitting so that light can pass through the electrode. The organic active layer emits light through the light-transmitting electrode upon application of electricity across the electrodes. Additional electroactive layers may be present between the light-emitting layer and the electrode(s).

It is well known to use organic electroluminescent compounds as the active component in light-emitting diodes. Simple organic molecules, such as anthracene, thiadiazole derivatives, and coumarin derivatives are known to show electroluminescence. In some cases these small molecule materials are present as a dopant in a host material to improve processing and/or electronic properties.

OLEDs emitting different colors, usually red, green, and blue, can be used as subpixel units in displays Both passive matrix and active matrix displays are known.

OLEDs emitting white light can be used for lighting applications. There is a continuing need for new OLED structures and processes for making them for lighting applications.

SUMMARY

There is provided an organic light-emitting diode luminaire comprising a first electrode, a second electrode, and a light-emitting layer therebetween, wherein the light-emitting layer comprises a small molecule host material having dispersed therein a first dopant having a first emitted color and a second dopant having a second emitted color, and wherein the overall emission color is white.

There is also provided an OLED luminaire as described above, in which the light-emitting layer further comprises a third dopant having a third emitted color.

There is also provided a process for making an OLED luminaire, comprising:
providing a substrate having a first electrode thereon;
depositing a first liquid composition comprising a small molecule host material, a first dopant having a first emitted color, and a second dopant having a second emitted color, all in a first liquid medium; and
forming a second electrode overall;
wherein the overall emission color of the luminaire is white.

There is also provided a process for forming an OLED luminaire as described above, wherein the light-emitting layer further comprises a third dopant having a third emitted color.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 2:
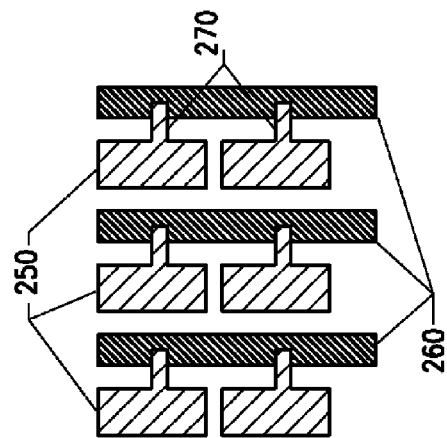
FIG. 2 is an illustration of an anode design.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Luminaire, the Light-Emitting Layer, the Other Device Layers, the Process and finally Examples.

1. Definitions and Clarification of Terms

Before addressing details of embodiments described below, some terms are defined or clarified.

The term "blue" is intended to mean radiation that has an emission maximum at a wavelength in a range of approximately 400-500 nm.

The term "CRI" refers to the CIE Color Rendering Index. It is a quantitative measure of the ability of a light source to reproduce the colors of various objects faithfully in comparison with an ideal or natural light source. A reference source, such as black body radiation, is defined as having a CRI of 100.

The term "dopant" is intended to mean a material, within a layer including a host material, that changes the wavelength(s) of radiation emission of the layer compared to the wavelength(s) of radiation emission in the absence of such material. A dopant of a given color refers to a dopant which emits light of that color.

The term "green" is intended to mean radiation that has an emission maximum at a wavelength in a range of approximately 500-600 nm.

The term "host material" is intended to mean a material, usually in the form of a layer, to which a dopant may or may not be added. The host material may or may not have electronic characteristic(s) or the ability to emit, receive, or filter radiation. When a dopant is present in a host material, the host material does not significantly change the emission wavelength of the dopant material.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid medium" is intended to mean a liquid material, including a pure liquid, a combination of liquids, a solution, a dispersion, a suspension, and an emulsion. Liquid medium is used regardless whether one or more solvents are present.

The term "luminaire" refers to a lighting panel, and may or may not include the associated housing and electrical connections to the power supply.

The term "overall emission" as it refers to a luminaire, means the perceived light output of the luminaire as a whole.

The term "pixellated" is intended to mean divided into small repeating units, called pixels. The pixels are small enough so that they are not distinguishable individually by the human eye.

The term "red" is intended to mean radiation that has an emission maximum at a wavelength in a range of approximately 600-700 nm.

The term "small molecule," when referring to a compound, is intended to mean a compound which does not have repeating monomeric units. In one embodiment, a small molecule has a molecular weight no greater than approximately 2000 g/mol.

The term "yellow" is intended to mean radiation that has an emission maximum at a wavelength in a range of approximately 550-600 nm.

The term "white light" refers to light perceived by the human eye as having a white color.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. The Luminaire

Figure 1B:
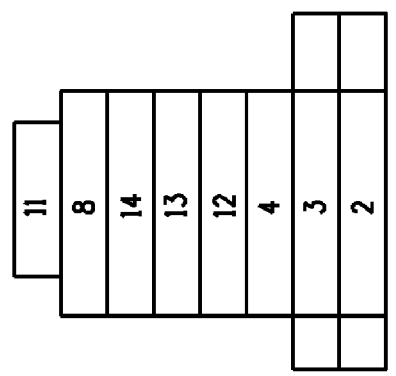
FIG. 1(b) is an illustration of another prior art white light-emitting device.
Figure 1A:
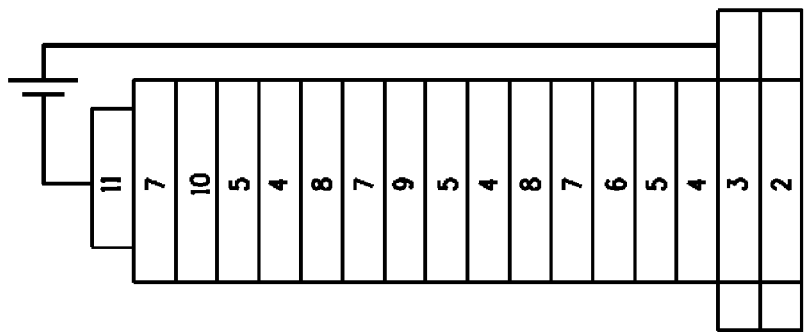
FIG. 1(a) is an illustration of one prior art white light-emitting device.

It is known to have white light-emitting layers in which emissive layers of different colors are stacked on top of each other between an anode and a cathode. Two exemplary prior art devices are shown in FIG. 1. In FIG. 1a, the anode 3 and the cathode 11 have a blue light-emitting layer 6, a green light-emitting layer 9, and a red light-emitting layer 10 stacked between them on substrate 2. On either side of the light-emitting layers are hole transport layers 4, electron transport layers 8. there are also hole blocking layers 7 and electron blocking layers 5. In FIG. 1b, the substrate 2, anode 3, hole transport layer 4, electron transport layer 8 and cathode 11 are present as shown. Light-emitting layer 12 is a combination of yellow and red light-emitters in a host material. Light-emitting layer 13 is a blue light-emitting in a host material. Layer 14 is an additional layer of host material.

The luminaire described herein has a single light-emitting layer containing at least two light-emitting materials.

The luminaire has a first electrode, a second electrode, and a light-emitting layer therebetween. The light-emitting layer comprises at least a small molecule host material, a first light-emitting material having a first emitted color, and a second light-emitting material having a second emitted color. The first color is not the same as the second color. The additive mixing of the emitted colors results in an overall emission of white light. At least one of the electrodes is at least partially transparent to allow for transmission of the generated light. In some embodiments, at least one of the electrodes is patterned and the light-emitting layer is pixellated.

One of the electrodes is an anode, which is an electrode that is particularly efficient for injecting positive charge carriers. In some embodiments, the anode is patterned. In some embodiments, the anode is patterned into parallel stripes. In some embodiments, the anode is at least partially transparent.

The other electrode is a cathode, which is an electrode that is particularly efficient for injecting electrons or negative charge carriers. In some embodiments, the cathode is a continuous, overall layer.

When the light-emitting layer is pixellated, the individual pixels can be of any geometric shape. In some embodiments, they are rectangular or oval.

In some embodiments, the light-emitting layer of the OLED luminaire further comprises a third light-emitting material having a third emitted color. The third color is different from both the first and second colors. In some embodiments, at least one of the colors is blue. In some embodiments, the first, second and third colors are red, green, and blue, respectively.

The OLED device also includes bus lines for delivering power to the device. In some embodiments of pixellated devices, some of the bus lines are present in the active area of the device, spaced between the lines of pixels. The bus lines may be present between every x number of pixel lines, where x is an integer and the value is determined by the size and electronic requirements of the luminaire. In some embodiments, the bus lines are present every 10-20 pixel lines. In some embodiments, the metal bus lines are ganged together to give only one electrical contact for several lines of pixels.

The ganging together of the electrodes allows for simple drive electronics and consequently keeps fabrication costs to a minimum. A potential problem that could arise with such a design is that the development of an electrical short in any of the pixels could lead to a short-circuit of the whole luminaire and a catastrophic failure. In some embodiments, this can be addressed by designing the pixels to have individual "weak links". As a result, a short in any one pixel will only cause a failure of that pixel—the rest of the luminaire will continue to function with an unnoticed reduction in light output. One possible anode design is shown in FIG. 2. The anode 250 is connected to the metal bus line 260 by a narrow stub 270. The stub 270 is sufficient to carry the current during operation but will fail if the pixel should short circuit, thereby isolating the short to a single pixel.

In some embodiments, the OLED luminaire includes bank structures to define the pixel openings. The term "bank structure" is intended to mean a structure overlying a substrate, wherein the structure serves a principal function of separating an object, a region, or any combination thereof within or overlying the substrate from contacting a different object or different region within or overlying the substrate.

In some embodiments, the OLED luminaire further comprises additional layers. In some embodiments, the OLED luminaire further comprises one or more charge transport layers. The term "charge transport," when referring to a layer, material, member, or structure is intended to mean such layer, material, member, or structure facilitates migration of such charge through the thickness of such layer, material, member, or structure with relative efficiency and small loss of charge. Hole transport layers facilitate the movement of positive charges; electron transport layers facilitate the movements of negative charges. Although light-emitting materials may also have some charge transport properties, the term "charge transport layer, material, member, or structure" is not intended to include a layer, material, member, or structure whose primary function is light emission.

In some embodiments, the OLED luminaire further comprises one or more hole transport layers between the light-emitting layer and the anode. In some embodiments, the OLED luminaire further comprises one or more electron transport layers between the light-emitting layer and the cathode.

In some embodiments, the OLED luminaire further comprises a buffer layer between the anode and a hole transport layer. The term "buffer layer" or "buffer material" is intended to are electrically conductive or semiconductive materials. The buffer layer may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device.

The OLED luminaire can additionally be encapsulated to prevent deterioration due to air and/or moisture. Various encapsulation techniques are known. In some embodiments, encapsulation of large area substrates is accomplished using a thin, moisture impermeable glass lid, incorporating a desiccating seal to eliminate moisture penetration from the edges of the package. Encapsulation techniques have been described in, for example, published US application 2006/0283546.

The OLED luminaire may also include outcoupling enhancements to increase outcoupling efficiency and prevent waveguiding on the side of the device. Types of light outcoupling enhancements include surface films on the viewing side which include ordered structures like e.g. micro spheres or lenses. Another approach is the use of random structures to achieve light scattering like sanding of the surface and or the application of an aerogel.

There can be different variations of OLED luminaires which differ only in the complexity of the drive electronics (the OLED panel itself is the same in all cases). The drive electronics designs can still be very simple. In some embodiments, the drive electronics require only a simple stabilized DC voltage supply.

3. Light-Emitting Layer

The light-emitting layer comprises a small molecule host, a first light-emitting material as a dopant, and a second light-emitting material as a dopant.

a. Light-Emitting Materials

Any type of light-emitting material can be used as the dopant in the devices, including, but not limited to, small molecule organic fluorescent compounds, fluorescent and phosphorescent metal complexes, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof.

In some embodiments, the dopant is a cyclometalated complex of iridium. In some embodiments, the complex has two ligands selected from phenylpyridines, phenylquinolines, and phenylisoquinolines, and a third ligand with is a β-dienolate. The ligands may be unsubstituted or substituted with F, D, alkyl, CN, or aryl groups.

In some embodiments, the dopant is selected from the group consisting of a non-polymeric spirobifluorene compound and a fluoranthene compound.

In some embodiments, the dopant is a compound having aryl amine groups. In some embodiments, the dopant is selected from the formulae below:

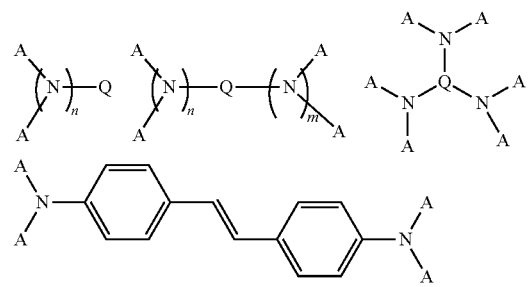

where:

A is the same or different at each occurrence and is an aromatic group having from 3-60 carbon atoms;

Q is a single bond or an aromatic group having from 3-60 carbon atoms;

n and m are independently an integer from 1-6.

In some embodiments of the above formula, at least one of A and Q in each formula has at least three condensed rings. In some embodiments, m and n are equal to 1.

In some embodiments, Q is a styryl or styrylphenyl group.

In some embodiments, Q is an aromatic group having at least two condensed rings. In some embodiments, Q is selected from the group consisting of naphthalene, anthracene, chrysene, pyrene, tetracene, xanthene, perylene, coumarin, rhodamine, quinacridone, and rubrene.

In some embodiments, A is selected from the group consisting of phenyl, tolyl, naphthyl, and anthracenyl groups.

In some embodiments, the dopant has the formula below:

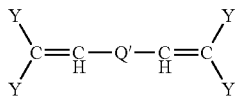

where:

Y is the same or different at each occurrence and is an aromatic group having 3-60 carbon atoms;

Q' is an aromatic group, a divalent triphenylamine residue group, or a single bond.

In some embodiments, the dopant is an aryl acene. In some embodiments, the dopant is a non-symmetrical aryl acene.

In some embodiments, the dopant is a chrysene derivative. The term "chrysene" is intended to mean 1,2-benzophenanthrene. In some embodiments, the dopant is a chrysene having aryl substituents. In some embodiments, the dopant is a chrysene having arylamino substituents. In some embodiments, the dopant is a chrysene having two different arylamino substituents. In some embodiments, the chrysene derivative has a deep blue emission.

In OLED displays, pure colors are necessary for a wide color gamut. However, in the OLED luminaire described herein, color purity is not necessary. The light-emitting materials can be chosen based on high luminous efficiency instead, as long as high CRI values are obtainable. Different combinations of materials and ratios can be selected such that the light emission falls on the black body curve of the C.I.E. chromaticity scale (Commission Internationale de L'Eclairage, 1931).

In some embodiments, the light-emitting layer comprises at least one blue dopant. Examples of blue dopants include, but are not limited to, diaminoanthracenes, diaminochrysenes, diaminopyrenes, and cyclometalated complexes of Ir having phenylpyridine ligands. Blue dopants have been disclosed in, for example, U.S. Pat. No. 6,875,524, and published US applications 2007-0292713 and 2007-0063638.

In some embodiments, the light-emitting layer consists essentially of a small molecule host having dispersed therein a blue dopant and a second dopant having a second emitted color. In some embodiments, the second emitted color is selected from red and yellow.

In some embodiments, the second dopant is a yellow dopant. The ratio of blue:yellow can be in the range of 10:1 to 80:1. In some embodiments, the ratio is 20:1 to 40:1. Examples of yellow dopants include, but are not limited to, rubrenes, naphthacenes, and fluoroanthenes. Yellow dopants have been disclosed in, for example, U.S. Pat. Nos. 6,875,524 and 6,627,333, and published US application 2007-0063638.

In some embodiments, the second dopant is a red dopant. The ratio of blue:red can be in the range of 10:1 to 80:1. In some embodiments, the ratio is 20:1 to 40:1. Examples of red dopants include, but are not limited to, cyclometalated complexes of 1r having phenylquinoline or phenylisoquinoline ligands, periflanthenes, fluoranthenes, and perylenes. Red dopants have been disclosed in, for example, U.S. Pat. No. 6,875,524, and published US application 2005-0158577.

In some embodiments, the light-emitting layer includes a blue dopant, a yellow dopant, and a red dopant. The ratio of blue:(yellow+red) can be in the range of 10:1 to 80:1. In some embodiments, the ratio is 20:1 to 40:1. The ratio of yellow:red can be in the range of 10:1 to 1:10.

Unexpectedly and surprisingly, the emission color of the devices described herein does not substantially change with time. There is little or no differential aging of the different dopants. Thus the initial ratio of emission peaks is substantially the same as the ratio at the half-life of the device.

b. Host Materials

The small molecule host material is one in which the dopants can be mixed homogeneously. The host facilitates the light emission of the dopants, but does not significantly alter their wavelength of emission.

In some embodiments, the small molecule host is a bis-condensed cyclic aromatic compound.

In some embodiments, the small molecule host is an anthracene derivative compound. In some embodiments the compound has the formula:

where:

An is an anthracene moiety;

L is a divalent connecting group.

In some embodiments of this formula, L is a single bond, —O—, —S—, —N(R)—, or an aromatic group. In some embodiments, An is a mono- or diphenylanthryl moiety.

In some embodiments, the small molecule host has the formula:

where:

An is an anthracene moiety;

A is the same or different at each occurrence and is an aromatic group.

In some embodiments, the A groups are attached at the 9- and 10-positions of the anthracene moiety. In some embodiments, A is selected from the group consisting naphthyl, naphthylphenylene, and naphthylnaphthalene. In some embodiments the compound is symmetrical and in some embodiments the compound is non-symmetrical.

In some embodiments, the small molecule host has the formula:

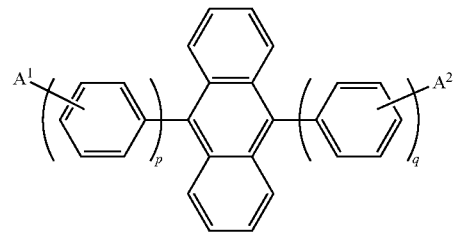

where:

$A^1$ and $A^2$ are the same or different at each occurrence and are selected from the group consisting of H, an aromatic group, and an alkenyl group, or A may represent one or more fused aromatic rings;

p and q are the same or different and are an integer from 1-3.

In some embodiments, the anthracene derivative is non-symmetrical. In some embodiments, p=2 and q=1. In some embodiments, at least one of $A^1$ and $A^2$ is a naphthyl group.

4. Other Device Layers

The materials to be used for the other layers in the luminaire described herein can be any of those known to be useful in OLED devices.

The anode is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

The optional buffer layer comprises buffer materials. The term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions.

The buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The buffer layer can comprise charge transfer compounds, and the like, such as copper phthalocyanine and the tetrathiafulvalene-tetracyanoquinodimethane system (TTF-TCNQ). In one embodiment, the buffer layer is made from a dispersion of a conducting polymer and a colloid-forming polymeric acid. Such materials have been described in, for example, published U.S. patent applications 2004-0102577, 2004-0127637, and 2005/205860.

The hole transport layer comprises hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'-bis(4-ethylphenyl)[1,1'-(3, 3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027.

The electron transport layer can function both to facilitate electron transport, and also serve as a buffer layer or confinement layer to prevent quenching of the exciton at layer interfaces. Preferably, this layer promotes electron mobility and reduces exciton quenching. Examples of electron transport materials which can be used in the optional electron transport layer, include metal chelated oxinoid compounds, including metal quinolate derivatives such as tris(8-hydroxyquinolato) aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato) zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof.

The cathode, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and $Li_2O$ can also be deposited between the organic layer and the cathode layer to lower the operating voltage. This layer may be referred to as an electron injection layer.

The choice of materials for each of the component layers is preferably determined by balancing the positive and negative charges in the emitter layer to provide a device with high electroluminescence efficiency.

In one embodiment, the different layers have the following range of thicknesses: anode 110, 500-5000 Å, in one embodiment 1000-2000 Å; buffer layer, 50-2000 Å, in one embodiment 200-1000 Å; hole transport layer, 50-2000 Å, in one embodiment 200-1000 Å; light-emitting layer, 10-2000 Å, in one embodiment 100-1000 Å; electron transport layer, 50-2000 Å, in one embodiment 100-1000 Å; cathode, 200-10000 Å, in one embodiment 300-5000 Å. The desired ratio of layer thicknesses will depend on the exact nature of the materials used.

The OLED luminaires described herein can have several advantages over incumbent lighting materials. The OLED luminaires have the potential for lower power consumption than incandescent bulbs. Efficiencies of greater than 50 lm/W may be achieved. The OLED luminaires can have Improved light quality vs. fluorescent. The color rendering can be greater than 80, vs that of 62 for fluorescent bulbs. The diffuse nature of the OLED reduces the need for an external diffuser unlike all other lighting options.

In addition, the OLED luminaires described herein have advantages over other white light-emitting devices. The structure is much simpler than devices with stacked light-emitting layers. There is higher material utilization than with devices formed by evaporation of light-emitting materials. It is possible to use fluorescent or phosphorescent dopants.

4. Process

The process for making an OLED luminaire, comprises:
providing a substrate having a first electrode thereon;
depositing a first liquid composition comprising a small molecule host material, a first dopant having a first emitted color, and a second dopant having a second emitted color, all in a first liquid medium; and
forming a second electrode overall; wherein the overall emission color of the luminaire is white.

In some embodiments, the liquid composition further comprises a third dopant having a third emitted color.

Any known liquid deposition technique can be used, including continuous and discontinuous techniques. Examples of continuous liquid deposition techniques include, but are not limited to spin coating, gravure coating, curtain coating, dip coating, slot-die coating, spray coating, and continuous nozzle coating. Examples of discontinuous deposition techniques include, but are not limited to, ink jet printing, gravure printing, and screen printing.

A suitable liquid medium for a particular combination of host and dopants can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Another suitable liquid for use in making the liquid composition, either as a solution or dispersion as described herein, comprising the new compound, includes, but not limited to, a chlorinated hydrocarbon (such as methylene chloride, chloroform, chlorobenzene), an aromatic hydrocarbon (such as a substituted or non-substituted toluene or xylene), including trifluorotoluene), a polar solvent (such as tetrahydrofuran (THF), N-methylpyrrolidone (NMP)), an ester (such as ethylacetate), an alcohol (such as isopropanol), a ketone (such as cyclopentatone), or any mixture thereof. Examples of mixtures of solvents for light-emitting materials have been described in, for example, published US application 2008-0067473.

After deposition, the material is dried to form a layer. Any conventional drying technique can be used, including heating, vacuum, and combinations thereof.

In some embodiments, the composition is deposited in a pixellated pattern. The pixels can have any shape, but are generally oval or rectangular.

In some embodiments, the process further comprises deposition of a chemical containment layer to define the pixel areas. The term "chemical containment layer" is intended to mean a patterned layer that contains or restrains the spread of a liquid material by surface energy effects rather than physical barrier structures. The term "contained" when referring to a layer, is intended to mean that the layer does not spread significantly beyond the area where it is deposited. The term "surface energy" is the energy required to create a unit area of a surface from a material. A characteristic of surface energy is that liquid materials with a given surface energy will not wet surfaces with a lower surface energy.

In some embodiments, the process uses as a substrate a glass substrate with patterned ITO and metal bus lines. The substrate may also contain bank structures to define the individual pixels. The bank structures can be formed and patterned using any conventional technique, such as standard photolithography techniques. Slot-die coating can be used to coat a buffer layer from aqueous solution, followed by a second pass through a slot-die coater for a hole transport layer. These layers are common to all pixels and consequently are not patterned. The light-emitting layers can be patterned using nozzle-printing equipment. In some embodiments, pixels are printed in columns with lateral dimensions of about 40 microns. Both the slot-die process steps and the nozzle-printing can be carried out in a standard clean-room atmosphere. Next the device is transported to a vacuum chamber for the deposition of the electron transport layer and the metallic cathode. This is the only step that requires vacuum chamber equipment. Finally the whole luminaire is hermetically sealed using encapsulation technology, as described above.

Note that not all of the activities described above in the general description are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A process for making an OLED luminaire, comprising:
providing a substrate having a first electrode thereon;
depositing a first liquid composition comprising a small molecule host material, a first light-emitting material as a first dopant having a first emitted color, and a second light-emitting material as a second dopant having a second emitted color, all in a first liquid medium, wherein the first dopant is a blue dopant selected from a chrysene derivative having arylamino substituents, the second emitted color is selected from a red dopant and a yellow dopant, and the ratio of first dopant to second dopant is 20:1 to 40:1; and wherein the yellow dopant is selected from the group consisting of rubrenes, naphthacenes, and fluoranthenes and wherein the red dopant is a red dopant which is a cyclometalated Ir complex having phenylquinoline or phenylisoquinoline ligands;
forming a second electrode overall;
wherein the overall emission color of the luminaire is white.

2. The process of claim 1, wherein the first electrode is patterned and the light-emitting layer is deposited in a pixellated pattern.

3. The process of claim 1, wherein the light-emitting layer further comprises a third light-emitting material as a third dopant having a third emitted color, wherein the first dopant is a blue dopant, the second dopant is a yellow dopant, and the third dopant is a red dopant; and wherein the ratio of blue dopant:(yellow dopant+red dopant) is 20:1 to 40:1.

4. The process of claim 3, wherein the ratio of yellow dopant:red dopant is in the range of 10:1 to 1:10.

5. The process of claim 1, wherein the liquid medium is a polar solvent selected from the group consisting of $C_1$ to $C_{20}$ alcohols, ethers, and acid esters.

6. The process of claim 1, wherein the liquid medium is a non-polar solvent selected from the group consisting of $C_1$ to $C_{12}$ alkanes, toluene, xylenes, and trifluorotoluene.

7. The process of claim 1, wherein the liquid medium is selected from the group consisting of methylene chloride, chloroform, chlorobenzene a substituted or non-substituted toluene or xylene, tetrahydrofuran N-methylpyrrolidone an ester ethylacetate, isopropanol, cyclopentatone, and any mixture thereof.

8. The process of claim 1, which further comprises deposition of a chemical containment layer to define pixel areas.

9. The process of claim 1, wherein the small molecule host material is selected from a material having the formula:

An-L-An where:
  An is an anthracene moiety;
  L is a divalent connecting group;
and a material having the formula:

A-An-A where:
  An is an anthracene moiety;
  A is the same or different at each occurrence and is an aromatic group.

* * * * *